United States Patent
Imura et al.

(10) Patent No.: US 7,003,875 B2
(45) Date of Patent: Feb. 28, 2006

(54) METHOD FOR MANUFACTURING PIEZO-RESONATOR

(75) Inventors: Masaaki Imura, Tokyo (JP); Kenji Inoue, Tokyo (JP); Eiju Komuro, Tokyo (JP); Hisatoshi Saitou, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/968,976

(22) Filed: Oct. 21, 2004

(65) Prior Publication Data
US 2005/0090033 A1  Apr. 28, 2005

(30) Foreign Application Priority Data
Oct. 22, 2003  (JP)  ............................. 2003-361567

(51) Int. Cl.
H05K 3/02  (2006.01)
B44C 1/22  (2006.01)
H01L 4/04  (2006.01)

(52) U.S. Cl. ................... 29/847; 29/25.35; 29/594; 29/846; 216/79; 310/367

(58) Field of Classification Search ............... 29/25.35, 29/594, 846, 847; 216/79, 99, 100; 310/311, 310/312, 363, 367
See application file for complete search history.

(56) References Cited

U.S. PATENT DOCUMENTS 5,075,641 A  *  12/1991  Weber et al. ............ 331/108 C
5,500,988 A  *  3/1996  Moynihan et al. ......... 29/25.35
5,691,752 A  *  11/1997  Moynihan et al. ............ 347/68
5,892,416 A  *  4/1999  Unami et al. ................ 333/187
6,142,615 A  *  11/2000  Qiu et al. ...................... 347/70
2002/0123177 A1  9/2002  Ruby et al.
2002/0153965 A1  10/2002  Ruby et al.

FOREIGN PATENT DOCUMENTS

JP  2002-335141  11/2002
JP  2003-22074  1/2003

* cited by examiner

Primary Examiner—A. Dexter Tugbang
Assistant Examiner—Tai Van Nguyen
(74) Attorney, Agent, or Firm—McGinn IP Law Group, PLLC (57) ABSTRACT

A method for manufacturing a piezo-resonator including: a first step of forming an upper electrode layer 20 on the piezoelectric film 14, a second step of coating the upper electrode layer 20 with a resist 21 and of performing patterning on the resist so as to have a shape of the upper electrode, a third step of masking the patterned resist 21 and removing the upper electrode layer 20 other than masked portions and forming two or more first upper electrodes 15a, a fourth step of removing the resist 21, a fifth step of coating the first upper electrodes 15a with a resist and performing patterning on the resist so that the first upper electrodes 15a are partially exposed, a sixth step of etching each of the exposed first upper electrodes 15a by a specified thickness to form a second upper electrode 15b, and a seventh step of removing the resist 22.

9 Claims, 7 Drawing Sheets

METHOD FOR MANUFACTURING PIEZO-RESONATOR

BACKGROUND OF THE INVENTION

1. Field of the Invention

The present invention relates to a method for manufacturing a piezo-resonator and more particularly to technology being effectively used in the method for manufacturing the piezo-resonator that operates at resonant frequencies being different from one another in particular.

2. Description of the Related Art

When a filter is constructed of a piezo-resonator using a BAW (Bulk Acoustic Wave) that propagates through a piezoelectric film, it is necessary that two or more piezo-resonators are employed which operate at resonant frequencies being different from one another. Generally, this can be achieved by making a film thickness of an upper electrode be varied in each of the two or more piezo-resonators. Moreover, the upper electrode is formed by patterning operations using lithography technology.

Therefore, when a filter having a desired frequency characteristic is formed on a same filter, patterning and frequency adjustment by changing a film thickness are essential in a process of forming an upper electrode.

Here, the patterning to be performed on an upper electrode and its frequency adjustment employed in conventional manufacturing methods of a piezo-resonator are described in Japanese Patent Application Laid-open No. 2002-335141 and Japanese Patent Application Laid-open No. 2003-22074, as will later be described more in detail. Moreover, in the description, it is assumed that the filter is made up of a piezo-resonator that operates at two resonant frequencies (resonant frequencies A and B) being different from one another.

However, the conventional manufacturing methods of a piezo-resonator described in Japanese Patent Applications Laid-open No. 2002-335141 and No. 2003-22074 inevitably need many steps for manufacturing a piezo-resonator that operates at resonant frequencies being different from one another.

SUMMARY OF THE INVENTION

In view of the above, it is an object of the present invention to provide a manufacturing method which is capable of manufacturing, in less steps, a piezo-resonator that operates at resonant frequencies being different from one another.

According to a first aspect of the present invention, there is provided a method for manufacturing a piezo-resonator for obtaining a signal having a specified resonant frequency by using a lower electrode formed on a substrate and an upper electrode formed on a side opposite to the lower electrode with a piezoelectric film being interposed between the lower electrode and the upper electrode, the method including:

a first step of forming an upper electrode layer on the piezoelectric film;

a second step of coating the upper electrode layer with a resist and of performing patterning on the resist so as to have a shape of the upper electrode;

a third step of masking the patterned resist and removing the upper electrode layer other than masked portions and forming two or more first upper electrodes;

a fourth step of removing the resist;

a fifth step of coating the first upper electrodes with a resist and performing patterning on the resist so that the first upper electrodes are partially exposed;

a sixth step of etching each of the exposed first upper electrodes by a specified thickness to form a second upper electrode; and a seventh step of removing the resist.

According to a second aspect of the present invention, there is provided a method for manufacturing a piezo-resonator for obtaining a signal having a specified resonant frequency by using a lower electrode formed on a substrate and an upper electrode formed on a side opposite to the lower electrode with a piezoelectric film being interposed between the lower electrode and the upper electrode, the method including:

a first step of coating the piezoelectric film with a resist;

a second step of performing patterning on the resist so that the piezoelectric film is exposed in a manner to form a shape of the upper electrode;

a third step of forming an upper electrode layer on the patterned resist and on the exposed piezoelectric film;

a fourth step of removing the resist together with the upper electrode layer formed on an upper surface of the resist and forming two or more first upper electrodes on the piezoelectric layer;

a fifth step of coating the first upper electrodes with a resist and performing patterning on the resist so that the first upper electrodes are partially exposed;

a sixth step of etching each of the exposed first upper electrodes by a specified thickness to form a second upper electrode; and a seventh step of removing the resist.

In the foregoing, a preferable mode is one that wherein includes:

a step of adjusting a frequency to obtain a first resonant frequency using the lower electrode and the first upper electrodes by etching each of the first upper electrodes by a specified thickness, after the fourth step and before the fifth step; and a step of obtaining a second resonant frequency by using the lower electrode and the second upper electrode in the sixth step.

Also, a preferable mode is one wherein, in the third step, at least one first dummy upper electrode being not used in actual operations is formed to construct at least one dummy resonator at the same time and wherein, in the step of adjusting the frequency, while the first upper electrodes and the first dummy upper electrode are being etched, the first resonant frequency is adjusted by using the first dummy resonator and wherein, in the fifth step, the first dummy upper electrode is coated with a resist and patterning is performed on the resist so that the first dummy upper electrode is exposed and wherein, in the sixth step, the second resonant frequency is adjusted by using a second dummy resonator equipped with a second dummy upper electrode formed by etching both the exposed first upper electrode and the exposed first dummy upper electrode by a specified thickness.

Also, a preferable mode is one wherein, prior to the first step, a dielectric film is formed on the piezoelectric film.

With the above configuration, a first upper electrode is formed in the fourth step and a second upper electrode having a film thickness being smaller than that of the first upper electrode is formed in the sixth step and adjustment of a resonant frequency is made possible during the process of forming the second upper electrode and, therefore, the piezo-resonator that operates at resonant frequencies being different from one another can be formed in less steps.

With another configuration, the number of times of film deposition for the upper electrode is only one and, therefore, a fear that the electrode becomes electrically high-resistant which is produced by such the repetition of the film deposition as employed in the conventional second manufacturing method can be removed.

With still another configuration, a dielectric film is formed on a piezoelectric film and thereon an upper electrode is formed and, therefore, a temperature characteristic of the piezo-resonator can be improved and a sharp frequency characteristic can be acquired.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Figure 1:
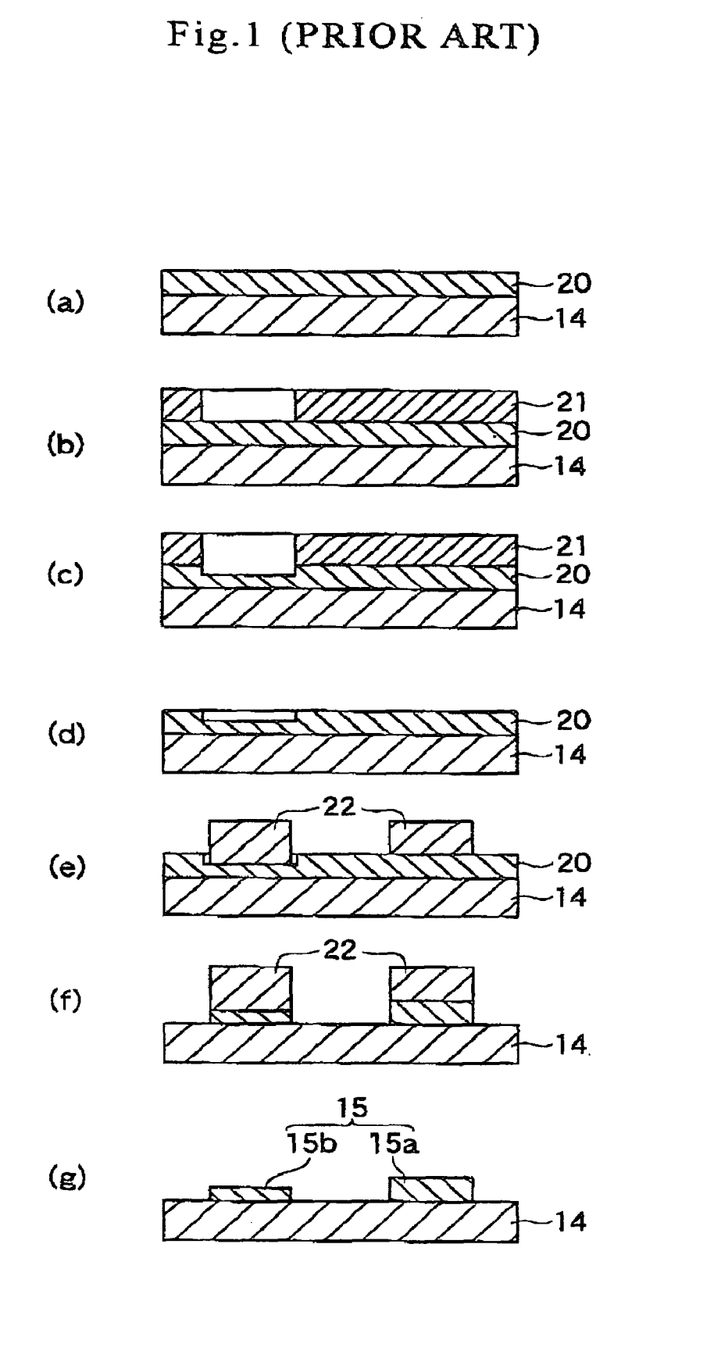
FIG. 1 is a cross-sectional view illustrating a first conventional method of manufacturing a piezo-resonator in the order of processes.
Figure 2:
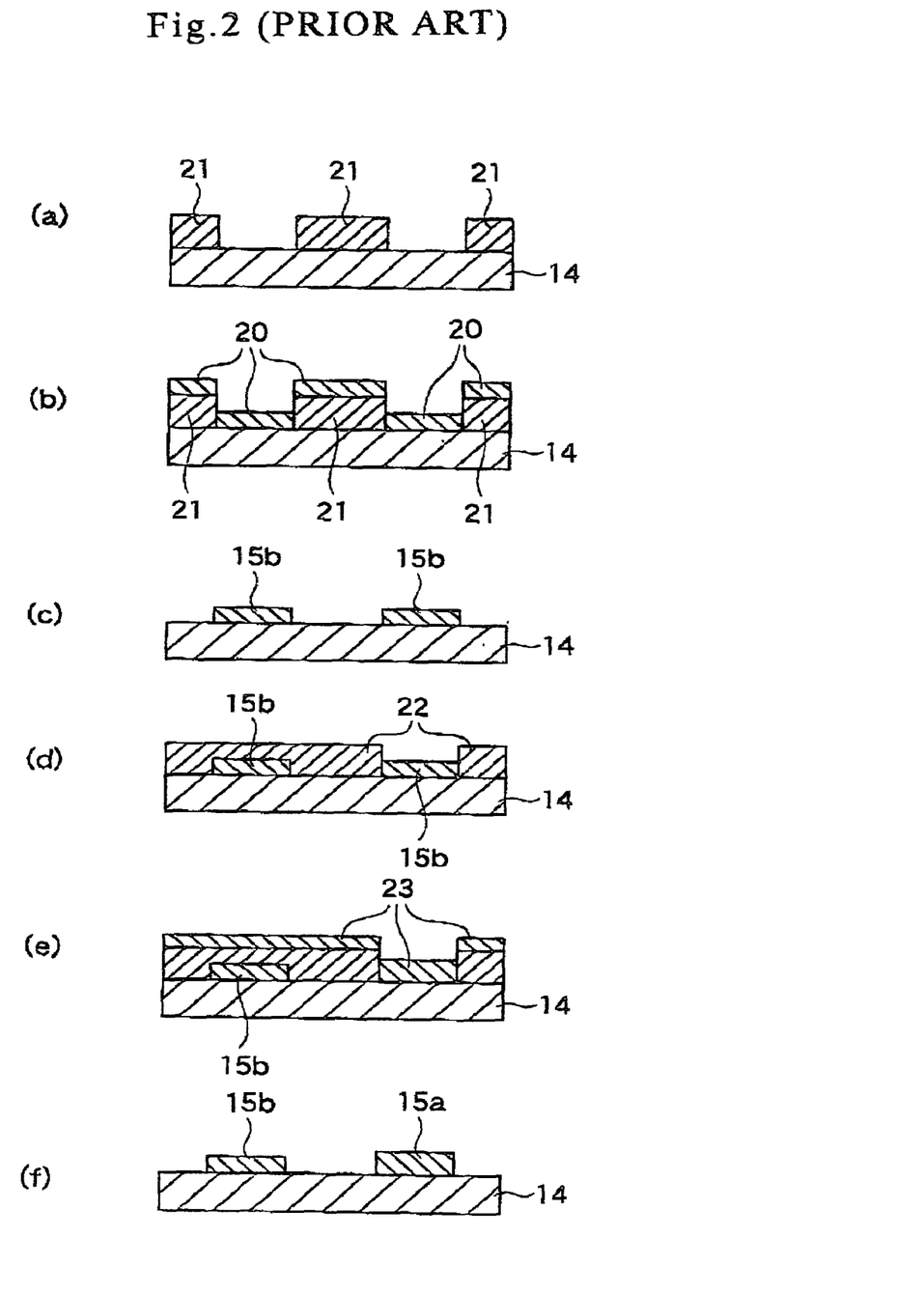
FIG. 2 is a cross-sectional view illustrating a second conventional method of manufacturing a piezo-resonator in the order of processes.

Referring to FIGS. 1 and 2, description is, at first made about the conventional manufacturing methods of a piezo-resonator described in Japanese Patent Applications Laid-open No. 2002-335141 and No. 2003-22074 in order to facilitate an understanding of the present invention.

A first conventional manufacturing method is such as disclosed in Japanese Patent Application Laid-open No. 2002-335141 in which, as shown in FIG. 1, an upper electrode layer 20 is formed on a piezoelectric film 14 [FIG. 1(a)] and then coating with a resist 21 is performed thereon and patterning is performed on the resist 21 so that a shape of an upper electrode is partially formed [FIG. 1(b)]. Next, the patterned resist 21 is masked and the upper electrode layer 20 except the masked portions is etched by a designated thickness [FIG. 1(c)] and the resist 21 is then removed [FIG. 1(d)]. Then, further coating with a resist 22 is performed thereon and then patterning is performed on the resist 22 so that all shapes of the upper electrodes are formed [FIG. 1(e)] and the patterned resist 22 is masked and the upper electrode layer 20 except than masked portions is removed [FIG. 1(f)]. Finally, by removing the resist 22 [FIG. 1(g)], a first upper electrode 15a having a thick film from which a resonant frequency A is obtained and a second upper electrode 15b having a thin film from which a resonant frequency B is obtained are formed.

Also, a second conventional manufacturing method is such as disclosed in Japanese Patent Application Laid-open No. 2003-22074, in which, as shown in FIG. 2, a piezoelectric film 14 is coated with a resist 21 and patterning is performed the resist 21 so that a shape of an upper electrode is formed [FIG. 2(a)] and then an upper electrode layer 20 is formed thereon [FIG. 2(b)] and the resist 21 is removed [FIG. 2(c)]. At this time point, upper electrodes 15b having the same film thickness are formed. Next, coating with a resist 22 is performed thereon and patterning is performed on the resist 22 so that the upper electrodes 15 is partially exposed [FIG. 2(d)] and an upper electrode layer 23 is again formed thereon [FIG. 2(e)] and the resist 22 is removed [FIG. 2(f)]. By this process, a first upper electrode 15a having a thick film from which a resonant frequency A is obtained and a second upper electrode 15b having a thin film from which a resonant frequency B is obtained are formed, However, the above first manufacturing method has a problem. That is, in its final process [FIG. 1(g)], the operation of the patterning is completed and the upper electrodes have been separated. Therefore, for the first time thereafter, operations of adjusting a frequency including steps of measuring a resonant frequency to be taken once for each of the upper electrodes 15a and 15b, two times in total, are made possible. Due to this, in order to make an individual adjustment of a frequency to each of the upper electrodes 15a and 15b, masking operations in every step of adjusting a frequency are needed, which causes many steps to be taken in total.

Also, the above second manufacturing method has also a problem. That is, first adjustment of a frequency is possible before the step shown in FIG. 2(d). However, second adjustment of a frequency is required after the step shown in FIG. 2(f) and, in this case, a process of masking one side of the upper electrode is needed, which causes long steps to be taken in total. Moreover, in the second manufacturing method, since film deposition on a part of the upper electrode is repeated twice, there is a fear of formation of a layer having a high electrical resistance at an interface of the upper electrode and of degradation in a resonant characteristic.

Now, best modes of carrying out the present invention will be described in further detail using various embodiments with reference to the accompanying drawings. In the drawings used in the embodiment, the same reference numbers are assigned to components having the same functions as those shown in other drawings and duplicated descriptions are omitted accordingly. Moreover, in following descriptions, the best mode of carrying out the present invention is explained and, therefore, the present invention is not limited to the embodiment provided here.

First Embodiment

Figure 3:
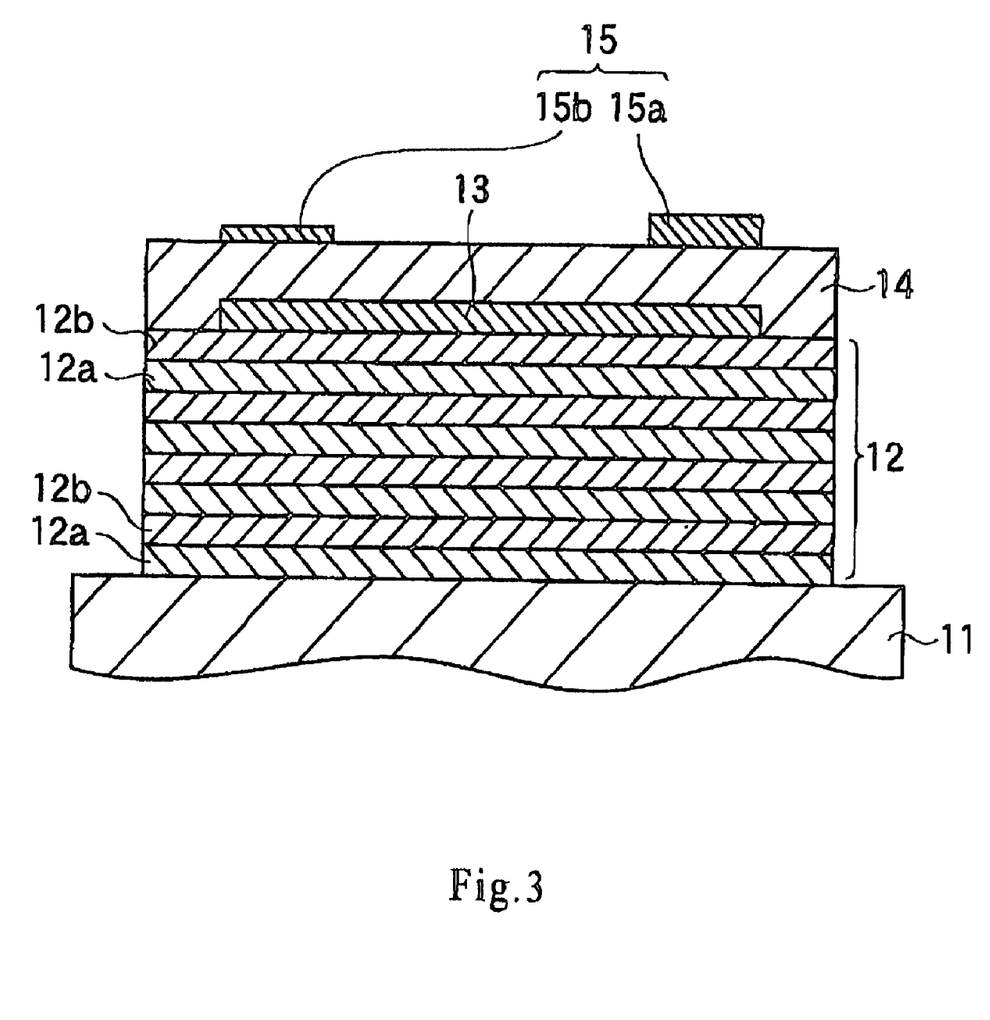
FIG. 3 is a cross-sectional view illustrating configurations of a piezo-resonator manufactured by a manufacturing method of an embodiment of the present invention.
Figure 4:
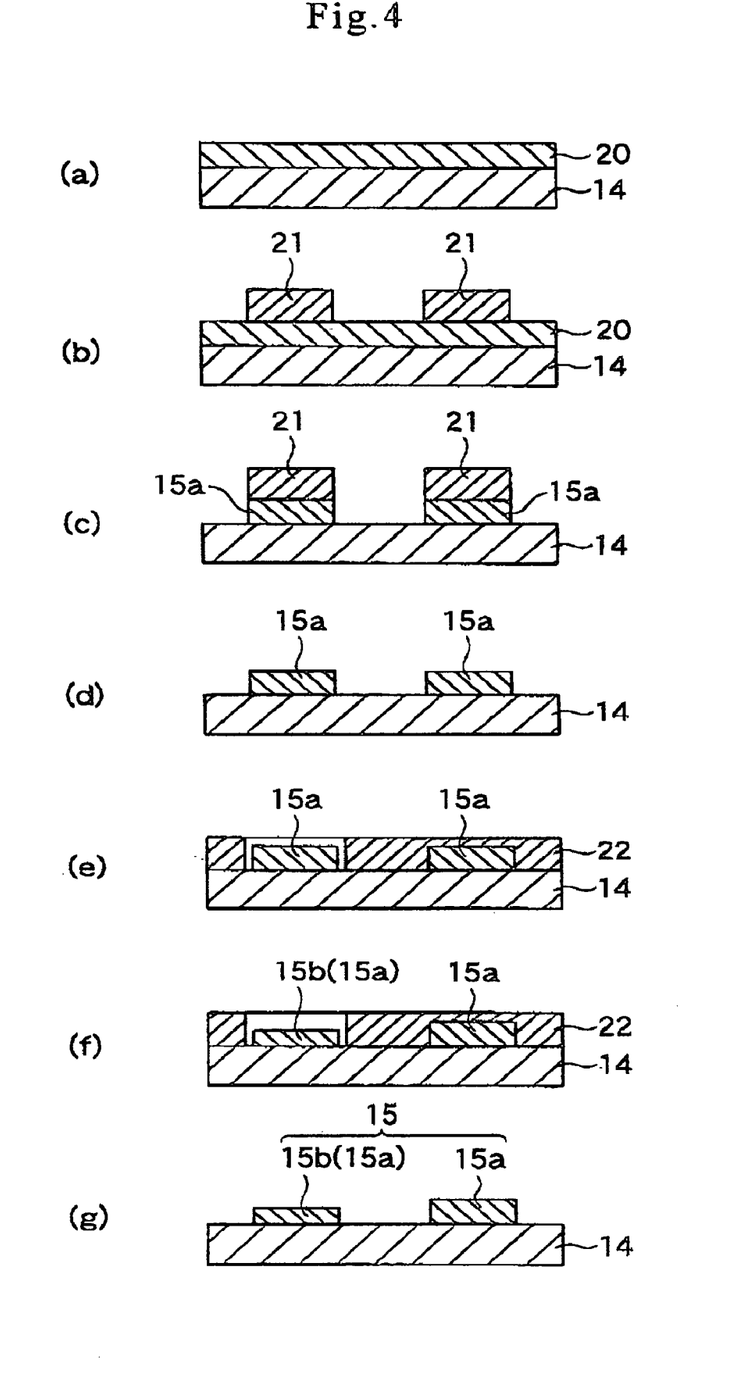
FIG. 4 is a cross-sectional view showing the manufacturing method, in the order of processes, of the piezo-resonator of the first embodiment of the present invention.
Figure 5:
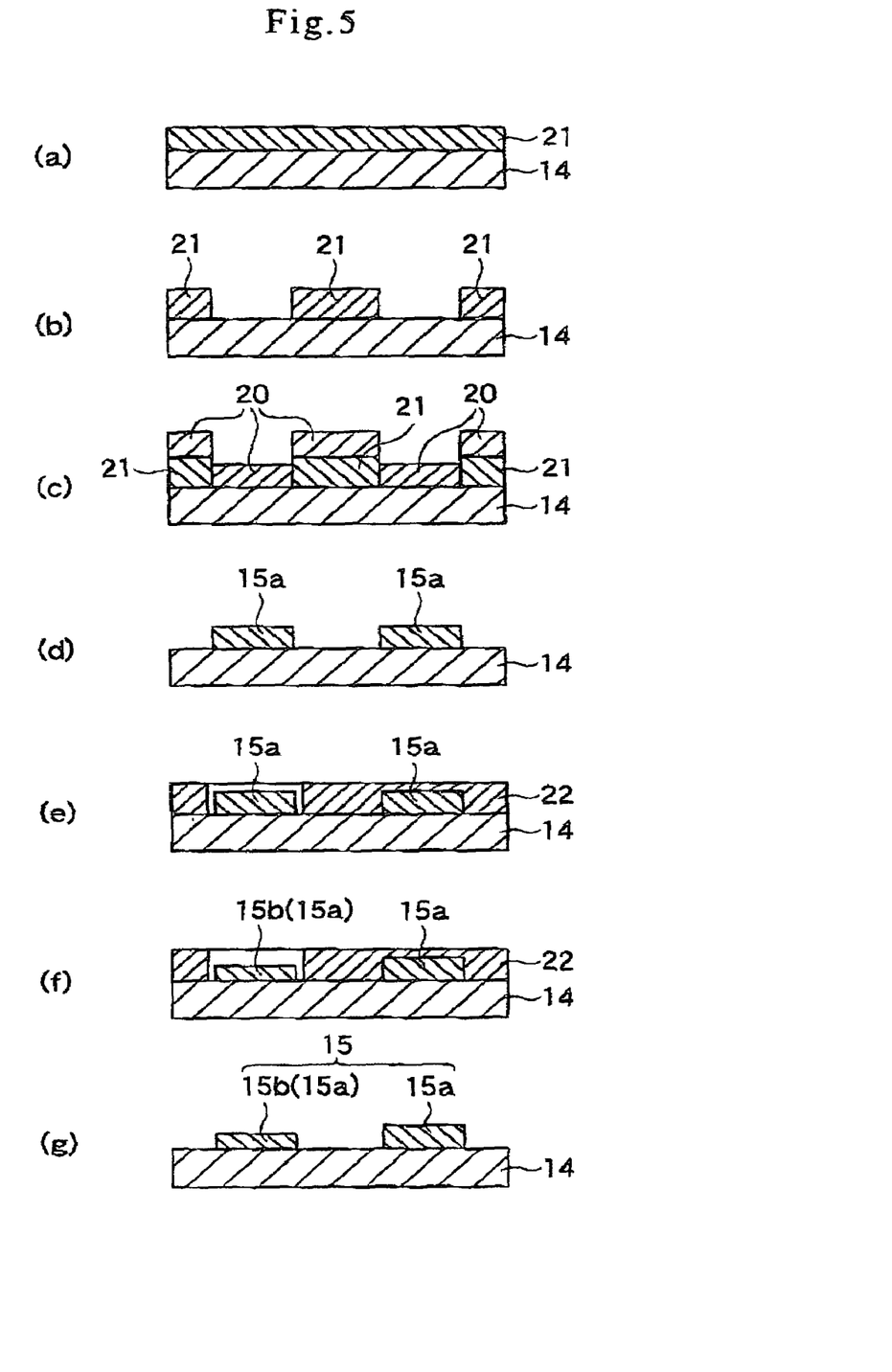
FIG. 5 is a cross-sectional view showing the manufacturing method, in the order of processes, of the piezo-resonator of another embodiment of the present invention.
Figure 6:
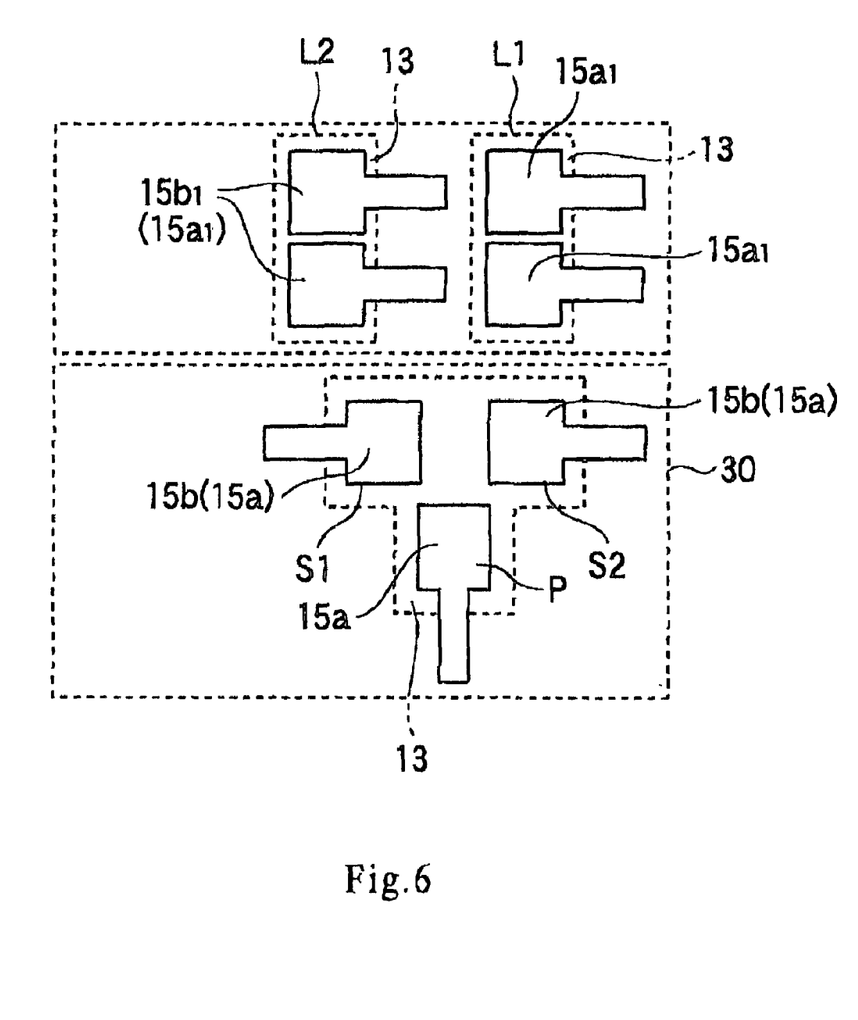
FIG. 6 is a plan view of the piezo-resonator manufactured by the manufacturing methods shown in FIGS. 4 and 5.
Figure 7:
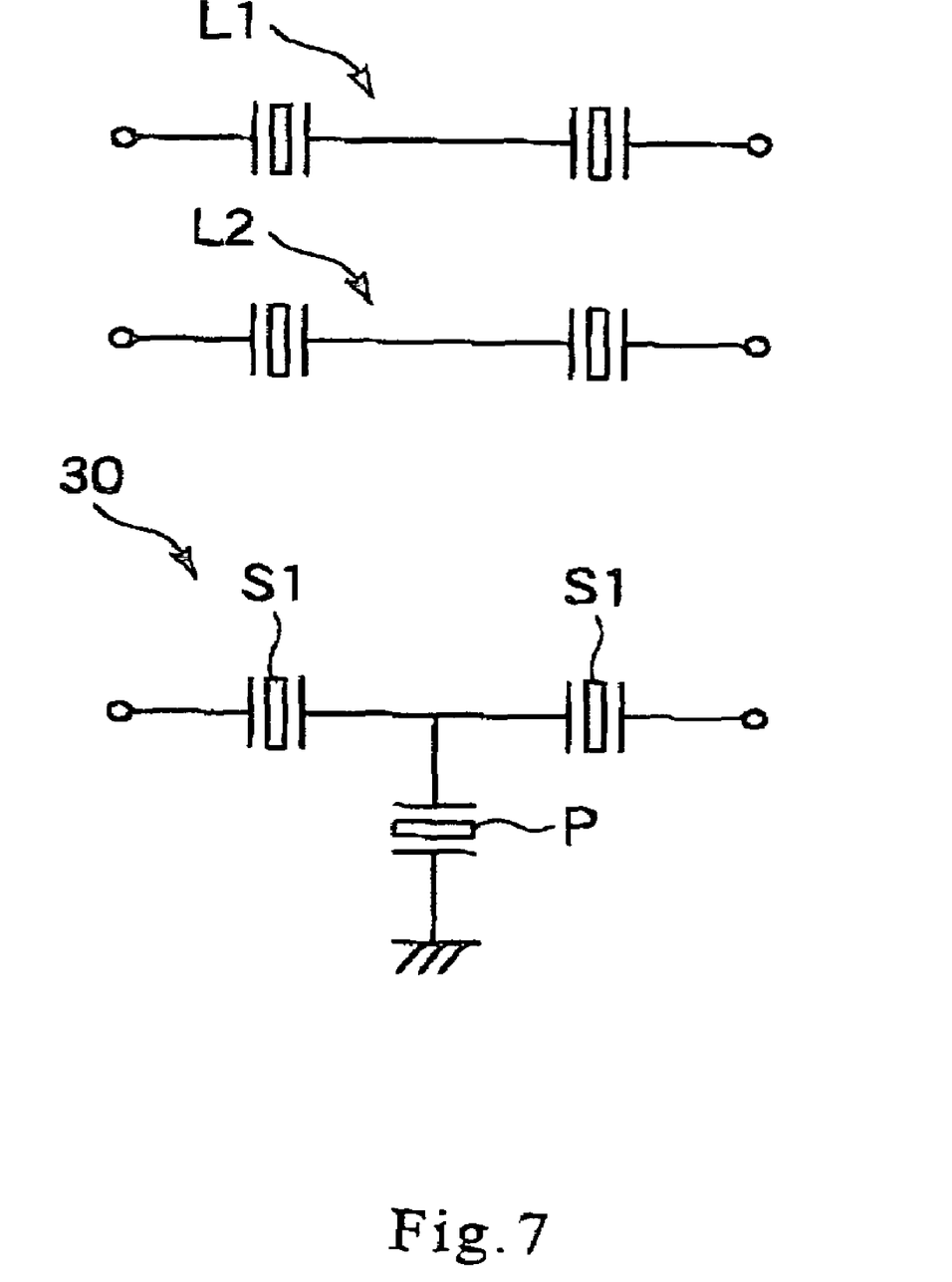
FIG. 7 is an equivalent circuit of the piezo-resonator shown in FIG. 6

FIG. 3 is a cross-sectional view illustrating configurations of a piezo-resonator manufactured by a manufacturing method of an embodiment of the present invention. FIG. 4 is a cross-sectional view showing the manufacturing method, in the order of processes, of the piezo-resonator of the embodiment of the present invention. FIG. 5 is a cross-sectional view showing the manufacturing method, in the order of processes, of the piezo-resonator of another embodiment of the present invention. FIG. 6 is a plan view of the piezo-resonator manufactured by the manufacturing methods shown in FIGS. 4 and 5. FIG. 7 is an equivalent circuit of the piezo-resonator shown in FIG. 6.

The piezo-resonator shown in FIG. 3 is called an SMR (Solidly Mounted Resonator)-type piezo-resonator in which an acoustic reflecting film 12 is formed on a substrate made of, for example, a single crystal silicon and the acoustic reflecting film 12 is made up of four pairs of layers, each pair including one thin film having a high acoustic impedance made of, for example, an aluminum nitride (AlN) film 12a and another thin film having a low acoustic impedance made of, for example, silicon oxide ($SiO_2$) film 12b, with the four pairs of layers being stacked alternately. On the acoustic reflecting film 12 is formed a lower electrode 13 obtained by depositing a platinum film (Pt) using a vacuum evaporation method and then by performing patterning on the Pt film by a lithography method.

Furthermore, on the lower electrode 13 is formed a piezoelectric film 14 made of zinc oxide (ZnO) by a sputtering method. Then, on the piezoelectric film 14 is formed an Al (aluminum) film by using the sputtering method and a patterning operation using the lithography method is performed on the Al film to form an upper electrode 15.

In such the piezo-resonator as described above, when an AC (alternating current) voltage is applied to the lower electrode 13 and the upper electrode 15, a signal having a specified resonant frequency can be obtained, owing to a piezoelectric effect, by a BAW which propagates through an inner portion of the piezo-resonator 14.

Moreover, in the embodiment, the acoustic reflecting films 12 is made up of 8 layers, however, it may be made up of three or more thin films each having a different acoustic impedance. Also, between the piezoelectric film 14 and the upper electrode 15 may be formed a dielectric film made of $SiO_2$ or the like in order to improve a temperature characteristic or acquire a sharp frequency characteristic.

A quality of each thin film and a method of forming it are not limited to what is described above and they are merely an example.

Next, a method for manufacturing the upper electrode 15 in the piezo-resonator having the configurations described above is explained by referring to FIGS. 4, 5, 6, and 7.

First, as shown in FIG. 4, an upper electrode 20 having a film thickness of 330 nm is formed on a piezoelectric film 14 by, for example, a sputtering method [first step, FIG. 4(a)]. The film thickness of the upper electrode 20 is a value obtained by adding about 10% of a designed film thickness to a thickness of a piezo-resonator designed so as to operate at the lowest resonant frequency. If such the dielectric film made of, for example, $SiO_2$ or a like as described above is additionally formed, prior to the formation of the upper electrode 20, the dielectric film is formed on the piezoelectric film 14.

Next, after the upper electrode layer 20 has been coated with the resist 21, patterning is performed on the resist 21 so that only portions corresponding to the upper electrode are covered with the resist 21 by using a lithography method [second step, FIG. 4(b)]. Then, a patterned resist 21 is masked and the upper electrode layer 20 except masked portions is removed using an ion milling device, by applying Ar+ (argon ion) at a beam current of 100 mA to form two or more first upper electrodes 15a each having a film thickness of 330 nm and, as a result, two or more resonators are formed and then separated [third step, FIG. 4(c)].

Then, the resist 21 being left on the first upper electrodes 15a is removed by an organic solvent [fourth step, FIG. 4(d)].

Instead of the steps described above, lift-off methods shown in FIG. 5(a) to FIG. 5(c) can be used.

That is, after a piezoelectric film 14 has been coated with a resist 21 [first step, FIG. 5(a)], patterning is performed on the resist 21 so that the piezoelectric film 14 is exposed in a manner to form a shape of an upper electrode [second step, FIG. 5(b)]. On the patterned resist 21 and exposed piezoelectric film 14 is formed an upper electrode film 20 [third step, FIG. 5(c)]. By removing the resist 21, the upper electrode layer 20 formed on an upper surface of the resist 21 is also removed at the same time and, as a result, two or more first upper electrodes 15a are formed on the piezoelectric film 14 [fourth step, FIG. 5(d)].

After the first upper electrodes 15a is formed by performing the fourth step, a total etching of the first upper electrodes 15a using an ion milling device and measurement of a resonant frequency are repeated (frequency adjusting step) until a resonant frequency (first resonant frequency "f1") of, for example, about 1.9 GHz by using the lower electrode 13 and the first upper electrodes 15a.

Moreover, if the upper electrode film 20 can be formed so as to have a desired thickness (here, 300 nm) as designed and, as a result, a desired resonant frequency is obtained without performing an etching process, the above frequency adjusting step may be omitted. Also, the etching method is not limited to the ion milling method and, for example, a wet process may be used accordingly.

Then, after the fourth step or the frequency adjusting step have been performed, the first upper electrodes 15a are coated with the resist 22 and patterning is performed on the resist 22 using a lithography method so that the first upper electrodes 15 to be etched is partially exposed [fifth step, FIG. 4 (e)]. Here, it is preferable that, in order to prevent an imperfect etching of the electrode described above, the etching is performed in a manner in which the partially-exposed first upper electrodes 15a becomes larger by 10 $\mu$m than an area in which resonance occurs.

Next, by etching each of the exposed first upper electrodes 15a by a specified thickness, a second upper electrode 15b having a thickness being smaller than 300 nm is formed [sixth step, FIG. 4(i)]. In this sixth step, until the resonant frequency of 1.96 GHz (second resonant frequency "f2") being about 3% higher than the 1.9 GHz being the resonant frequency "f1" of the first resonant frequency by using the lower electrode 13 and the second upper electrode 15b, the etching of the second upper electrode 15b and measurement of a resonant frequency are repeated.

However, such the repeated steps of performing the etching process and of measuring the resonant frequency may be omitted if a desired resonant frequency is obtained by one time etching process performed on the second upper electrode 15b.

Finally, after the resist 22 has been removed [seventh step, FIG. 4(g)], the fabrication of the piezo-resonator is complete.

Next, a method for adjusting a frequency by using the upper electrode 15 in the fifth step is described below.

That is, as shown in FIGS. 6 and 7, when a ladder-type filter 30 made up of a parallel-arm side piezo-resonator P that operates at, for example, the first resonant frequency "f1" and of serial-arm side piezo-resonators S1 and S2 that operate at, for example, the second resonant frequency "f2" is fabricated, in the third step, two or more first dummy upper electrodes $15a_1$ that are not used in actual operations are formed at the same time and two or more first dummy resonators L1 are formed in the vicinity of the two or more dummy upper electrodes $15a_1$. Then, in the frequency adjusting step, both the first electrodes 15a and the first dummy upper electrodes $15a_1$ are etched in a repeated manner and, while a resonant frequency is being measured by using the first dummy resonator L1, the first resonant frequency "f1" is adjusted.

Moreover, the reason why two resonators are serially connected to the first dummy resonator L1 is that a resonant frequency can be easily measured by having a measuring terminal contact upper electrode portions of these two resonators. In a dummy resonator in which a via-contact (through hole) is formed in a piezoelectric film and a lower electrode is partially exposed, even if the number of dummy resonators is one, a resonant frequency can be measured by having a measuring terminal contact both upper and lower electrodes of the dummy resonator. Therefore, the, number of the dummy resonators may be one or plural.

In the fifth step, the first dummy upper electrodes $15a_1$ is further coated with a resist and patterning is performed on the resist so that the first dummy upper electrodes $15a_1$ are partially exposed. At this time point, patterning is performed so that the first dummy upper electrodes $15a_1$ are totally etched.

Moreover, in the fifth step, as described above, an area being slightly wider than that of a resonant portion in the exposed first upper electrodes 15a is etched. This is because, in the lithography process, no etching caused by partial coating of the electrode with a resist due to a misalignment of a mask has to be prevented.

Then, in the sixth step, by using the second dummy resonator L2 formed by etching both exposed first upper electrodes 15a and each of the exposed first dummy upper electrodes $15a_1$ by a specified thickness, both the second upper electrode 15b and the second dummy upper electrode $15b_1$ are etched repeatedly and, while a resonant frequency is being measured, the second resonant frequency "f2" is adjusted.

Thus, in the embodiment of the present invention, since the first upper electrodes 15a are formed in the fourth step and the second upper electrode 15b having a film thickness being smaller than that of the first upper electrodes 15a are formed in the sixth step, a resonant frequency can be adjusted in the process of forming the second upper electrode 15b. This enables piezo-resonators that operate at resonant frequencies being different from one another to be formed in less steps. That is, the first frequency adjustment can be made after the fourth step has been performed and the second frequency adjustment can be made while the sixth step is being performed and, therefore, further steps are not needed and the upper electrode 15 can be fabricated in less steps.

Moreover, the number of times of deposition of the upper electrode 15 is only one and, therefore, like in the conventional second manufacturing method in which the deposition processes are repeated, there is no fear that the electrode becomes electrically high-resistant.

It is apparent that the present invention is not limited to the above embodiments but may be changed and modified without departing from the scope and spirit of the invention. For example, in the embodiment, the filter is made up of piezo-resonators that operate at resonant frequencies being different from one another However, even if the filter is made up of piezo-resonators that operate at three or more resonant frequencies, by repeating the steps (e) to (g) in FIGS. 4 and 5, the piezo-resonators can be applied.

Moreover, in the above embodiment, the case in which the present invention is applied to the SMR-type piezo-resonator is described. However, the present invention can be applied generally to a layer-stacked type piezo-resonator using a piezoelectric film such as a diaphragm-type piezo-resonator realized by partially notching a substrate and by making a BAW easily propagate.

What is claimed is:

1. A method for manufacturing a piezo-resonator for obtaining a signal having a specified resonant frequency by using a lower electrode formed on a substrate and an upper electrode formed on a side opposite to said lower electrode with a piezoelectric film being interposed between said lower electrode and said upper electrode, said method comprising:

forming an upper electrode layer on said piezoelectric film;

coating said upper electrode layer with a resist and performing patterning on said resist so as to have a shape of said upper electrode;

masking the patterned resist and removing said upper electrode layer other than masked portions and forming two or more first upper electrodes;

removing said resist;

coating said first upper electrodes with a second resist and performing patterning on said second resist so that said first upper electrodes are partially exposed;

etching the exposed first upper electrodes by a specified thickness to form a second upper electrode; and removing said second resist.

2. The method for manufacturing a piezo-resonator as claimed in claim 1, wherein, prior to said forming said upper electrode layer on said piezoelectric film, a dielectric film is formed on said piezoelectric film.

3. The method according to claim 1, wherein a film thickness of said upper electrode layer comprises a value obtained by adding about 10% of a designed film thickness to a thickness of a piezo-resonator designed to operate at a lowest resonant frequency.

4. The method according to claim 1, wherein said etching is repeated until said first upper electrodes and said lower electrode produce a resonant frequency of about 1.9 GHz.

5. The method according to claim 1, wherein said etching is performed such that an area of said first upper electrodes becomes 10 $\mu$m larger than an area at which resonance occurs.

6. A method for manufacturing a piezo-resonator for obtaining a signal having a specified resonant frequency by using a lower electrode formed on a substrate and an upper electrode formed on a side opposite to said lower electrode with a piezoelectric film being interposed between said lower electrode and said upper electrode, said method comprising:

forming an upper electrode layer on said piezoelectric film;

coating said upper electrode layer with a resist and performing patterning on said resist so as to have a shape of said upper electrode;

masking the patterned resist and removing said upper electrode layer other than masked portions and forming two or more first upper electrodes;

removing said resist;

coating said first upper electrodes with a second resist and performing patterning on said resist so that said first upper electrodes are partially exposed;

etching the exposed first upper electrodes by a specified thickness to form a second upper electrode;

removing said second resist;

adjusting a frequency to obtain a first resonant frequency using said lower electrode and said first upper electrodes by etching said first upper electrodes by a specified thickness, after said removing said second resist and before said coating said first upper electrodes with a second resist; and obtaining a second resonant frequency by using said lower electrode and said second upper electrode during said etching the exposed first upper electrodes.

7. The method for manufacturing a piezo-resonator as claimed in claim 6, wherein, in said masking the patterned resists, at least one first dummy upper electrode being not used in actual operations is formed to construct at least one dummy resonator at the same time, wherein, in said adjusting said frequency, while said first upper electrodes and said first dummy upper electrode are being etched, said first resonant frequency is adjusted by using said first dummy resonator, wherein, in said coating said first upper electrodes with said second resist, said first dummy upper electrode is coated with said resist and patterning is performed on said resist so that said first dummy upper electrode is exposed, and wherein, in said etching the exposed first upper electrodes, said second resonant frequency is adjusted by using a second dummy resonator equipped with a second dummy upper electrode formed by etching both the exposed first upper electrode and the exposed first dummy upper electrode by a specified thickness.

8. The method for manufacturing a piezo-resonator as claimed in claim 7, wherein, prior to said forming said upper electrode layer on said piezoelectric film, a dielectric film is formed on said piezoelectric film.

9. The method for manufacturing a piezo-resonator as claimed in claim 6, wherein, prior to said forming said upper electrode layer on said piezoelectric film, a dielectric film is formed on said piezoelectric film.

* * * * *